(12) United States Patent
Kung et al.

(10) Patent No.: US 6,971,443 B2
(45) Date of Patent: Dec. 6, 2005

(54) THERMAL MODULE WITH TEMPORARY HEAT STORAGE

(75) Inventors: Shao-Tsu Kung, Taipei (TW); Chen-Hua Liu, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 10/065,430

(22) Filed: Oct. 17, 2002

(65) Prior Publication Data

US 2004/0011503 A1   Jan. 22, 2004

Related U.S. Application Data

(62) Division of application No. 10/064,464, filed on Jul. 17, 2002, now Pat. No. 6,631,755.

(51) Int. Cl.[7] ............................................. F28D 17/00
(52) U.S. Cl. .................... 165/104.26; 361/700; 165/10
(58) Field of Search .................... 165/10, 902, 185, 165/104.26, 80.3; 361/700; 257/715

(56) References Cited

U.S. PATENT DOCUMENTS 4,415,118 A * 11/1983 Endo ............................ 165/10
6,260,613 B1 * 7/2001 Pollard, II .................. 165/185

* cited by examiner

*Primary Examiner*—Ljiljana V Ciric
(74) *Attorney, Agent, or Firm*—Winston Hsu

(57) ABSTRACT

A thermal module with temporary heat storage. The thermal module includes a heat storage, a heat absorber, a heat dissipater, and a heat pipe for rapidly transferring heat from the heat absorber to the heat dissipater. The heat storage includes a phase change material and is in contact with the heat pipe. When heat quantities generated by the system are greater than a predefined reasonable thermal target, heat in excess of the thermal target is temporarily absorbed into the heat storage through the melting of the PCM. When the heat quantities generated by the system are again less than the thermal target, the PCM re-freezes, releasing the stored heat to be dissipated normally.

15 Claims, 4 Drawing Sheets

THERMAL MODULE WITH TEMPORARY HEAT STORAGE

CROSS REFERENCE TO RELATED APPLICATIONS

This is a division of application Ser. No. 10/064,464 filed, Jul. 17, 2002 now U.S. Pat. No. 6,631,755.

BACKGROUND OF INVENTION

1. Field of the Invention

The present invention relates to a thermal module, more specifically, a thermal module that uses a phase change material to temporarily store excess heat.

2. Description of the Prior Art

Quantities of heat generated by modern electrical components are often large enough to severely damage or destroy the components that generate the heat if proper precautions are not taken. These precautionary measures range from passive heat sinks to liquid refrigeration systems, but all have one common purpose, to transfer heat away from the generating device.

A well-known approach is to enlist the aid of a heat pipe. The conventional heat pipe is a hollow, partially evacuated tube. Inside the tube is a wick-like structure composed of a copper mesh or a similarly functioning component saturated with a predetermined fluid. When an end of the heat pipe is exposed to a heat source, the contained fluid at that end of the heat pipe boils, rapidly transferring heat to a cooler end of the heat pipe where the gas condenses. The condensed gas is sucked back to the region of highest heat through a capillary action of the wicks. This process effectively transfers heat many times quicker and farther than could be done by using a solid bar of a high heat conducting substance such as copper.

Many variations of heat pipes, including looped heat pipes, are used in varying situations with varying degrees of success. One of the most common uses of a heat pipe is to rapidly transfer heat from an electrical component to a heat dissipater, often a fanned or passive heat dissipater similar to a finned heat sink. Efficiency of such a system dictates that the heat dissipater must be able to dispose of unwanted heat about as rapidly as it is absorbed by the heat pipe, otherwise the related temperatures will continue to climb. In a prior art thermal module, this ability to dissipate heat as quickly as heat is absorbed is critical. If the temperature inside the condensing portion of the heat pipe exceeds the boiling point of the internal fluid, even temporarily, the heat pipe fails to function as intended and damage to related electrical components is a likely result.

Please refer to FIG. 1 of a graph of the levels of heat generated by the electrical components in a PC during a hypothetical period of use. Two horizontal divisions are shown. Amounts of heat below the passive cooling limit will not vaporize the fluid in the heat pipe and are dissipated passively. During time periods when the quantity of heat generated exceeds the passive cooling level, the fluid in the heat pipe boils and the heat pipe begins to actively transfer heat away from the electrical components and to the heat dissipater. It is obvious that usages such as those requiring frequent hard drive activity or CD access generate more heat than typing in a word processing program. Therefore, the graph shows a typical series of peaks and valleys representing periods of higher and lower demands being placed on the system, and therefore higher and lower quantities of heat being generated.

However, because the efficiency of the system dictates that the heat dissipater must be able to dispose of unwanted heat about as rapidly as it is absorbed by the heat pipe, the entire thermal module must be designed around a thermal ceiling, the maximum quantity of heat that can be produced without damaging the electrical components. This thermal ceiling characteristic of the prior art thermal module makes it difficult to reduce the size of a thermal module, including the heat dissipater, a relatively large component occupying much needed space in many smaller applications. In fact, because faster CPUs generally generate larger amounts of heat, manufacturers face a serious conflict between the demand for a smaller product and the need to provide a large enough heat dissipater to accommodate the thermal ceilings in today's PCs.

SUMMARY OF INVENTION

It is therefore a primary objective of the claimed invention to disclose a thermal module whose design is not dictated by a thermal ceiling, allowing the use of a smaller heat dissipater, while providing adequate thermal protection to the related electrical components.

The claimed invention includes a heat pipe for rapidly transferring heat from a heat absorber to a heat dissipater, and a heat storage also in flush contact with the heat pipe. The heat storage includes a phase change material (PCM) that changes from a solid state to a liquid state at a predetermined and specific temperature approximately corresponding to a reasonable thermal target. A flexible, thermally and electrically insulated casing enclosing the PCM allows it to be placed in small areas between the electrical components, occupying no more than what is normally wasted space.

It is an advantage of the claimed invention that the use of the phase change material, to temporarily store excess heat in a system, allows a smaller thermal module designed around a reasonable thermal target to provide adequate thermal protection.

These and other objectives of the present invention will no doubt become obvious to those of ordinary skill in the art after reading the following detailed description of the preferred embodiment, which is illustrated in the various figures and drawings.

BRIEF DESCRIPTIONS OF DRAWINGS

DETAILED DESCRIPTION

The present invention thermal module includes a heat absorber, a heat dissipater, a heat pipe, and a phase change material to temporarily store heat generated by a system in excess of a reasonable thermal target.

Figure 1:
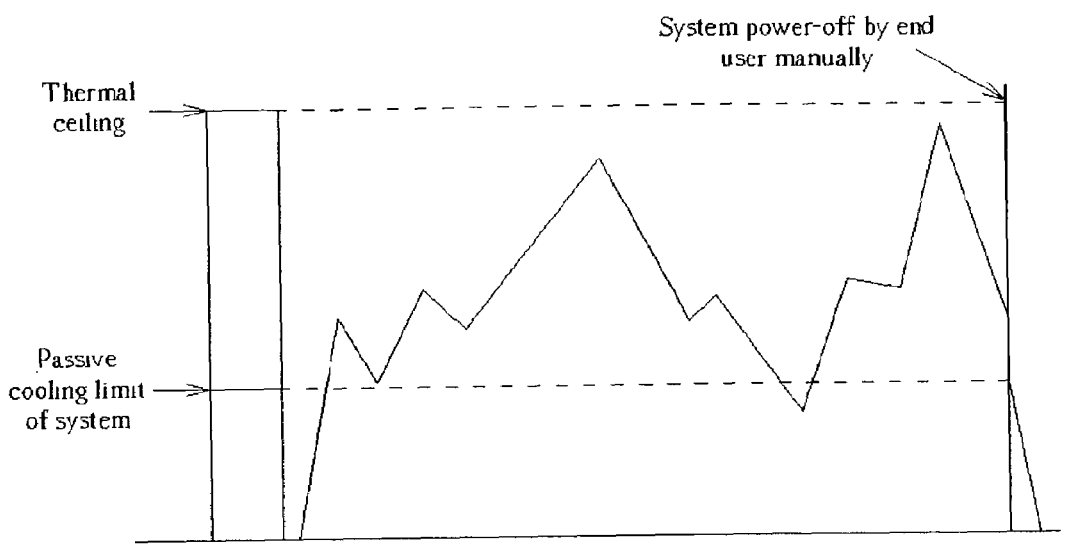
FIG. 1 is a graph of heat levels generated by a PC according to a prior art.
Figure 2:
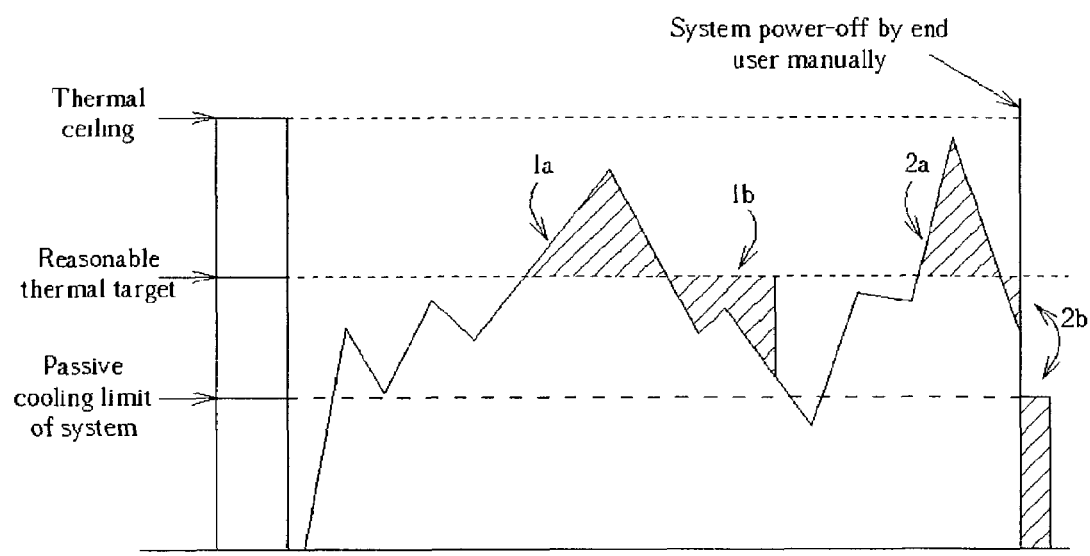
FIG. 2 is a graph of heat levels generated by a PC according to the present invention.

The chart of FIG. 2 depicts the levels of heat generated by electrical components in a typical laptop PC in a typical period of use. There are three horizontally divided areas, a passive cooling limit, a reasonable thermal target, and a thermal ceiling. The passive cooling limit represents the maximum quantity of heat that can be passively dissipated by the system through natural conduction, convection, or radiation. The thermal ceiling represents the maximum amount of heat that can be produced and tolerated by the system without damaging the electrical components. Above the passive cooling limit and below the thermal ceiling is the reasonable thermal target.

All computer systems undergo fluctuations in the intensity of demands placed on the system and therefore the quantity of heat produced. The most obvious example of a high demand use of the system is a program that requires intensive CPU utilization and frequent high-speed disk or CD access, such as merely playing a video. System demands during a word processing session, or more dramatically a standby state, are obviously lighter and result in a smaller quantity of heat being produced than when in a high demand situation. Therefore, the quantity of heat generated by the system during a typical period of use fluctuates as illustrated in FIG. 2.

It is obvious from the chart that designing a thermal module around the thermal ceiling results in excess thermal protection in all but extreme situations. Therefore the present invention replaces the concept of this seldom used thermal ceiling with a more practical, reasonable thermal target better representing the amount of heat generated by the system under normal operating conditions. Quantities of heat below the reasonable thermal target are absorbed and transferred via the heat pipe to the heat dissipater normally. When the system temporarily generates heat in excess of the thermal target, the excess heat $1a$, $2a$ is temporarily stored in the heat storage. During this time, amounts of heat up to the thermal target continue to be dissipated normally via the thermal dissipater while only the heat $1a$, $2a$ in excess of the thermal target is stored. When the system's generation of heat returns to a less extreme level and again falls below the thermal target, the stored heat $1a$, $2a$ is released back into the system to be dissipated normally.

Items $1b$ and $2b$ of FIG. 2 represent the stored heat $1a$, $2a$ after it has been released back into the system. The areas of the regions $1a$ and $1b$ are equal as are the areas of $2a$ and $2b$. In other words, the amount of heat absorbed by the PCM is equal to the amount of heat released by the PCM. Because the thermal module is designed to adequately actively dissipate levels of generated heat up to the reasonable thermal target, when the generation of heat falls below the thermal target, the thermal module is clearly able to additionally dissipate any heat that may be in storage.

In the preferred embodiment of the present invention, the heat storage comprises a phase change material to temporarily absorb the excess heat. A PCM such as wax-60 changes from a solid state to a liquid state between 53–60 degrees Celsius. The wax-60 has a latent heat of 264 J/g and the density of wax-60 is 1105 cm$^3$/kg. This translates into 100 grams of wax-60 being able to absorb 264,000 Joules (7.3 Watt-Hours) of heat while changing from a solid to a liquid. Another way to say it is that 100 grams of wax-60 can absorb 7.3 Watts of excess heat for an hour with minimal change in volume.

The use of wax-60 is only to be considered an example PCM in the present invention. The PCM could be another substance, such as paraffin wax, $H_2O$, $NA_2S_2+5H_2O$, Neopentyl glycol, etc. The change from a solid state to a liquid state is also only an example phase change. However, the change from a solid state to a liquid state has the distinct advantage of absorbing a relatively large amount of heat with a minimal change in volume.

The PCM can be enclosed in a flexible casing made of some electrically and thermally insulated material and can be of any shape or size. When combined with the constant volume characteristic stated above, the electrically and thermally insulated casing allows the PCM to be placed in unused gaps between existing system components without requiring additional space or system redesign.

Figure 3:
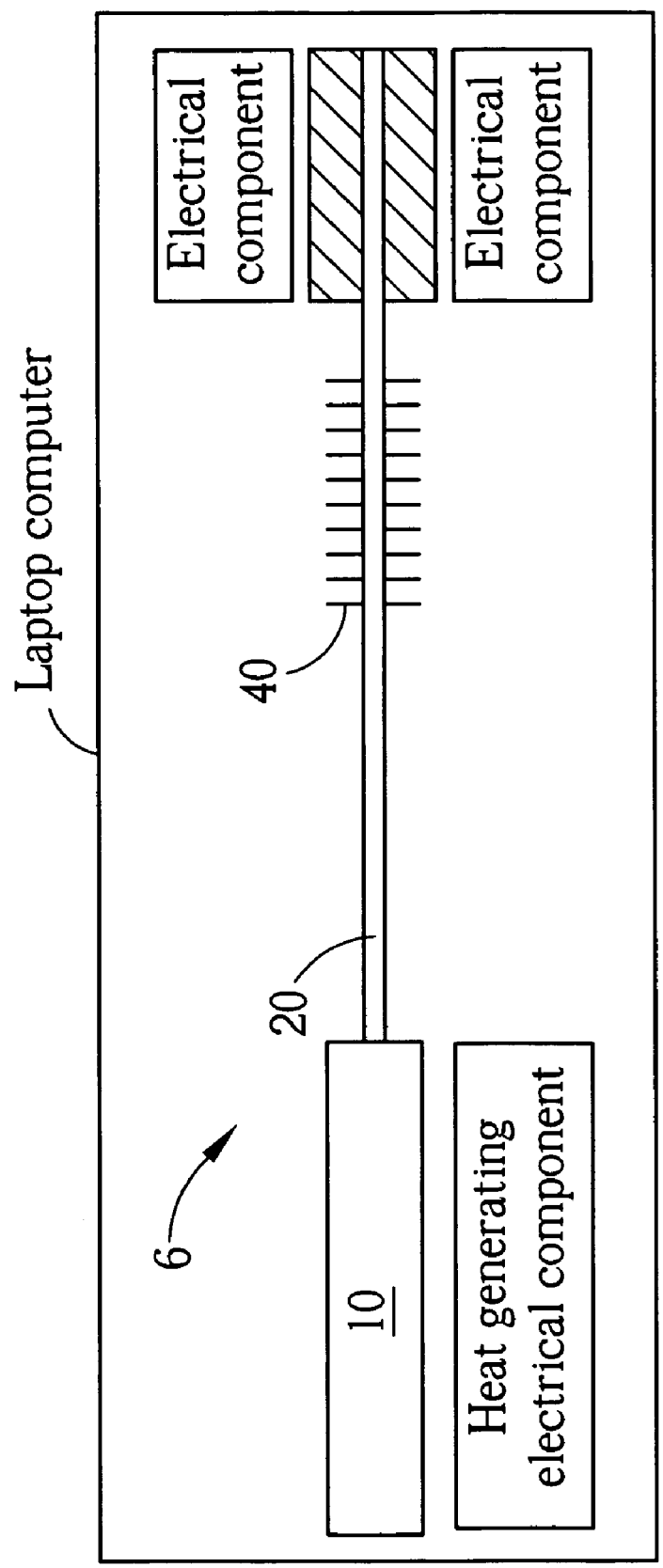
FIG. 3 is a structural diagram of a thermal module according to the present invention.
Figure 4:
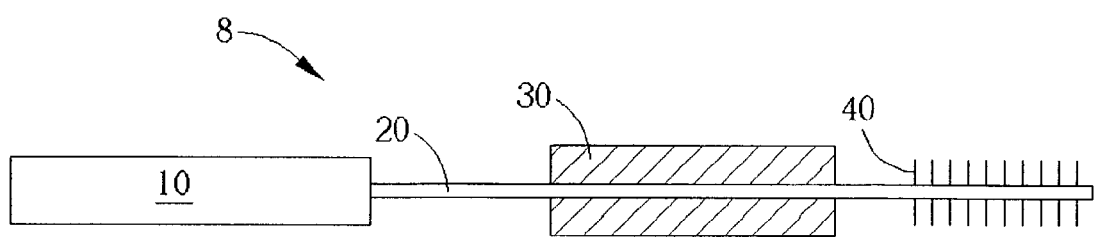
FIG. 4 is a structural diagram of another thermal module according to the present invention.

The operation of the present invention can best be seen in FIG. 3 and FIG. 4. FIG. 3 is a structural diagram of a thermal module 6 according to the present invention. FIG. 4 is a structural diagram of another thermal module 8 according to the present invention. The thermal module 6, 8 comprises a heat absorber 10, a heat pipe 20, a heat storage 30, and a heat dissipater 40. The heat pipe 20 is conventional in nature and is used to rapidly transfer heat from the heat absorber 10 to the heat dissipater 40. The heat dissipater 40 of the thermal module 6 is fixed to the heat pipe 20 between the heat absorber 10 and the heat storage 30 as shown in FIG. 3. However, the heat storage 30 of the thermal module 8 is fixed to the heat pipe 20 between the heat absorber 10 and the heat dissipater 40 as shown in FIG. 4. The operating principles of the heat pipe 20, the heat absorber 10, and the heat dissipater 40 are well know in the art and will not be further elaborated on here.

The heat storage 30 includes a PCM at least partially enclosed in an electrically and thermally insulated, flexible casing. An area of the PCM is in flush contact with the heat pipe 20 allowing high heat conductivity and low thermal resistance between the heat pipe 20 and the PCM.

When the laptop is initially turned on, the level of generated heat is below the passive cooling limit. Soon the system begins to generate heat in excess of the passive cooling limit and less than the thermal target. At this point, the fluid in the heat absorber 10 end of the heat pipe 20 begins to vaporize, quickly transporting heat from the heat absorber 10 to the heat dissipater 40. Because the PCM in the heat storage 30 does not change from a solid to a liquid until the thermal target has been reached, relatively little energy is absorbed by the PCM and the vast majority is removed from the system by the heat dissipater 40.

Occasionally, during a period of intense demand on system resources, the heat generated within the system increases to a value exceeding the thermal target. The PCM in the heat storage 30 begins to change from a solid state into a liquid state, absorbing heat in excess of the thermal target in the process. The heat pipe 20 continues to transfer heat to both the heat dissipater 40 and the PCM. The heat dissipater 40 continues to dispose of amounts of heat up to the thermal target while amounts of heat in excess of the thermal target are temporarily absorbed through the melting process of the PCM.

When the intensity of demands on system resources returns to normal and therefore the production of heat within the system again falls below the thermal target, the heat pipe 20 continues to carry heat from the heat absorber 10 to the heat dissipater 40. However, because the level of heat is below the thermal target and the freezing point of the PCM, the PCM begins to re-solidify, releasing stored heat in the process. Because the heat dissipater 40 is able to dispose of more heat than is currently being generated by the system, the heat dissipater 40 can also dispose of the released stored heat adequately.

The cycle of storing excess heat during periods of high heat generation and releasing the stored heat during periods of lower heat generation can be repeated as often as required and indefinitely. The use of the PCM to temporarily store heat produced in excess of the reasonable thermal target and releasing the stored heat when the system generates a lower level of heat is clearly more efficient than the prior art. This feature of the present invention offers a distinct advantage over the prior art in allowing a reduction in the size of the thermal module while maintaining adequate thermal protection.

Those skilled in the art will readily observe that numerous modifications and alterations of the device may be made while retaining the teachings of the invention. Although this disclosure discusses a thermal module in a laptop computer, the application of the present invention is not limited to a laptop PC. For example, all types of computers have heat dissipation concerns addressed by the present invention, as do many other kinds of devices. Additionally, the use of a plurality of types of PCMs for heat storage that change from one physical state to another physical state at differing temperatures should also be considered within the scope of the present invention. Accordingly, the above disclosure should be construed as limited only by the metes and bounds of the appended claims.

What is claimed is:

1. A thermal module for dissipating heat in a laptop computer, the thermal module comprising:
   a heat pipe for rapidly transferring heat;
   a heat absorber disposed at one end of the heat pipe for absorbing heat from an electrical component;
   a heat storage disposed at another end of the heat pipe for storing excess heat, the heat storage comprising a first phase change material and a second phase change material for heat storage by changing from one physical state to another physical state at a first and second temperature respectively; and
   a heat dissipater disposed at one section of the heat pipe between the heat absorber and the heat storage;
   wherein the first temperature is different from the second temperature and both the first and the second temperatures are lower than a third temperature that is capable of damaging the electrical component.

2. The thermal module of claim 1 wherein the heat storage is fixed flush against all surfaces contacting the heat pipe.

3. The thermal module of claim 1 wherein the heat storage is fixed flush against all surfaces contacting the heat dissipation region.

4. The thermal module of claim 1 wherein the heat storage comprises a casing.

5. The thermal module of claim 4 wherein the casing is flexible.

6. The thermal module of claim 4 wherein the casing comprises an electrically insulating layer.

7. The thermal module of claim 4 wherein the casing comprises a thermally insulating layer.

8. The thermal module of claim 6 wherein the first and second phase change materials are disposed within the casing.

9. The thermal module of claim 8 wherein the first and-second phase change materials are selected from the group consisting of wax, water, neopentyl glycol (NPG), and $Na_2S_2O_3+5H_2O$.

10. A thermal module for dissipating heat in a laptop computer, the thermal module comprising:
    a heat generating electrical component;
    a heat sink capable of dissipating a predefined thermal target quantity of heat corresponding to a predefined temperature;
    a heat pipe for transferring heat from the heat generating electrical component to the heat sink, one end of the heat pipe being in thermal contact with the heat generating electrical component, a section of the heat pipe being in thermal contact with the heat sink; and
    a heat storage device disposed at another end of the heat pipe so that the heat sink is between the heat storage device and the heat generating electrical component, the heat storage device comprising an electrically insulating casing and a first phase change material and a second phase change material confined within the casing, the first phase change material changing from one physical state to another physical state at the predefined temperature, the second phase change material changing from one physical state to another physical state at a temperature different than the predefined temperature and less than a temperature capable of damaging the electrical component, the heat storage device disposed in flush thermal contact with the heat pipe such that when the heat pipe transfers a quantity of heat from the heat generating electrical component to the heat sink in excess of the thermal target, the heat storage device absorbs and stores the excess heat.

11. The thermal module of claim 10 wherein the first phase change material and the second phase change material are selected from the group consisting of wax, water, neopentyl glycol (NPG), and $Na_2S_2O_3+5H_2O$.

12. The thermal module of claim 10 wherein the heat storage device is not in direct physical contact with the heat sink.

13. A thermal module for dissipating heat in a laptop computer, the thermal module comprising:
    a heat pipe;
    a heat generating electrical component in thermal contact with one end of the heat pipe;
    a heat storage device in thermal contact with another end of the heat pipe, the heat storage device comprising a thermally and electrically insulating casing at least partially enclosing a first phase change material, the first phase change material changing from solid state to a liquid state at a first predefined temperature; and
    a heat sink in thermal contact with the heat pipe between the electrical component and the heat storage device and not in direct physical contact with the heat storage device, the heat sink of a predetermined size maximally capable of continuously dissipating a predefined thermal target quantity of heat at the first predefined temperature, the thermal target being less then a maximum quantity of heat generated by the electrical component under operating conditions;
    wherein the heat storage device extends into gaps between electrical components of the laptop computer.

14. The thermal module of claim 13 wherein the thermally and electrically insulating casing further at least partially encloses a second phase change material, the second phase change material changing from solid state to a liquid state at a second predefined temperature, the second predefined temperature being different than the first predefined temperature and less than a temperature corresponding to a maximum quantity of heat generated by the electrical component under operating conditions.

15. The thermal module of claim 14 wherein the first phase change material and the second phase change material are selected from the group consisting of wax, water, neopentyl glycol (NPG), and $Na_2S_2O_3+5H_2O$.

* * * * *